(12) United States Patent  
Wang

(10) Patent No.: US 7,151,416 B2  
(45) Date of Patent: Dec. 19, 2006

(54) APPARATUS AND METHOD TO GENERATE A 50% DUTY CYCLE CLOCK IN A SINGLE-ENDED CRYSTAL OSCILLATOR

(75) Inventor: Hongwei Wang, San Jose, CA (US)

(73) Assignee: Broadcom Corporation, Irvine, CA (US)

( * ) Notice: Subject to any disclaimer, the term of this patent is extended or adjusted under 35 U.S.C. 154(b) by 37 days.

(21) Appl. No.: 11/086,760

(22) Filed: Mar. 23, 2005

(65) Prior Publication Data

US 2006/0061423 A1 Mar. 23, 2006

Related U.S. Application Data

(60) Provisional application No. 60/611,309, filed on Sep. 21, 2004.

(51) Int. Cl.  
*H03B 1/00* (2006.01)  
*H03K 3/00* (2006.01)

(52) U.S. Cl. .................................... 331/75; 327/291

(58) Field of Classification Search .............. 331/74, 331/75, 116 R, 116 FE, 158; 327/165, 172, 327/175, 295

See application file for complete search history.

(56) References Cited

U.S. PATENT DOCUMENTS 3,476,938 A * 11/1969 Falbel et al. ............. 250/338.1  
5,706,221 A * 1/1998 Paulsen ..................... 708/819  
2006/0061423 A1* 3/2006 Wang .......................... 331/16

\* cited by examiner

*Primary Examiner*—David Mis  
(74) *Attorney, Agent, or Firm*—Sterne, Kessler, Goldstein & Fox P.L.L.C.

(57) ABSTRACT

A clock generator includes an active oscillator portion that generates an oscillating signal having a frequency determined by a resonator, such as a crystal or other type of resonator. A filter or delay module filters or delays the oscillating signal to generate a second oscillating signal that has a DC component that matches that of the original oscillating signal. A comparator then compares the original oscillating signal with the filtered or delayed oscillating signal to determine the amplitude cross points. In other words, the comparator determines where the amplitude of the original oscillating signal crosses that of the filtered or delayed oscillating signal, and generates a square wave pulse at the amplitude cross points. Since both compared signals have a common DC component then the amplitude cross points will be equally separated in time, which produces an output oscillating signal with a 50% duty cycle.

19 Claims, 11 Drawing Sheets

APPARATUS AND METHOD TO GENERATE A 50% DUTY CYCLE CLOCK IN A SINGLE-ENDED CRYSTAL OSCILLATOR

CROSS REFERENCE TO RELATED APPLICATIONS

This Application claims the benefit of U.S. Provisional Application No. 60/611,309, filed on Sep. 21, 2004, which is incorporated herein by reference in its entirety.

BACKGROUND OF THE INVENTION

1. Field of the Invention

The present invention relates to single ended oscillators, and more specifically to generating a 50% duty cycle output signal using a single ended crystal oscillator.

2. Background Art

A crystal oscillator is a popularly used circuit block in an integrated circuit (IC), when a highly accurate clock is required. Often, a 50% duty cycle clock is preferred. The conventional configuration to generate a 50% duty cycle uses a differential crystal oscillator design. However, differential designs are difficult to design and generally more complicated. Another conventional technique is to use a single-ended design having a replica circuit to set the DC point which is used to compare with the oscillation waveform. Both configurations require significant current, and the latter one also introduces an inaccuracy because the replica circuit cannot generate an accurate copy of the DC component of the oscillation signal.

It is highly desirable to reduce current consumption so as to reduce overall power requirements. Therefore, what is needed is a crystal oscillator design that can generate an accurate 50% duty cycle oscillator signal with reduced current compared to conventional designs.

BRIEF SUMMARY OF THE INVENTION

A clock generator, efficiently and accurately, generates a clock signal having a 50% duty cycle in a single ended oscillator configuration. In embodiments of the invention, the clock generator includes an active oscillator portion that generates an oscillating sinusoidal signal having a frequency determined by a resonator, such as a crystal or other type of resonator. A filter or delay module filters or delays the oscillating signal to generate a second oscillating signal that has a DC component that matches that of the original oscillating signal. A comparator then compares the original oscillating signal with the filtered or delayed oscillating signal to determine the amplitude cross points. In other words, the comparator determines where the amplitude of the original oscillating signal crosses that of the filtered or delayed oscillating signal, and generates a square wave pulse at the amplitude cross points. Since both signals for comparison have a common DC component then the amplitude cross points will be equally separated in time, which produces an output oscillating signal with a 50% duty cycle.

In embodiments of the invention, the filtered signal is lowpass filtered using a passive RC circuit. However, other filter or delay configurations could be utilized.

The present invention reduces current consumption and is less complicated than conventional designs, including conventional differential designs. The present invention also provides a more accurate 50% duty cycle than some conventional designs.

Further features and advantages of the present invention, as well as the structure and operation of various embodiments of the present invention, are described in detail below with reference to the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Figure 1:
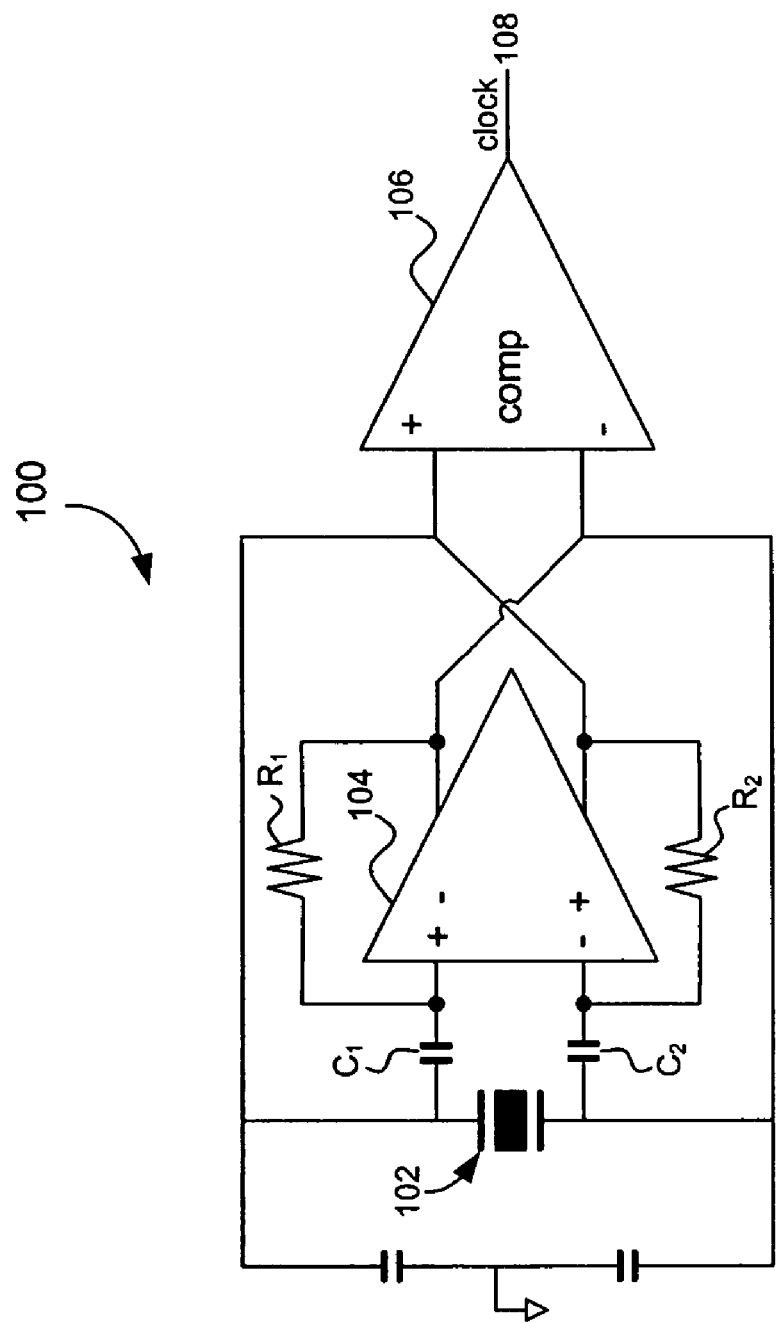
FIG. 1 illustrates a conventional differential oscillator structure.

FIG. 1 illustrates a conventional differential crystal oscillator circuit 100. Conventional oscillator circuit 100 includes a crystal 102, an amplifier 104, and a comparator 106, to produce a clock output (oscillating signal) 108 that has a substantially 50% duty cycle. As is shown, the output of the amplifier 104 is cross connected back to the input of the amplifier 104 in order to provide positive feedback that causes oscillation. Further, the comparator 106 receives the output of the amplifier 104 and generates a square wave based on the output of the amplifier 104. The differential design of the conventional oscillator 100 is complicated, difficult to design, and has high current consumption that is generally undesirable. Resistors $R_1$ and $R_2$ set up a DC operating point for the circuit, and capacitor $C_1$ and $C_2$ and provide DC decoupling.

Figure 2A:
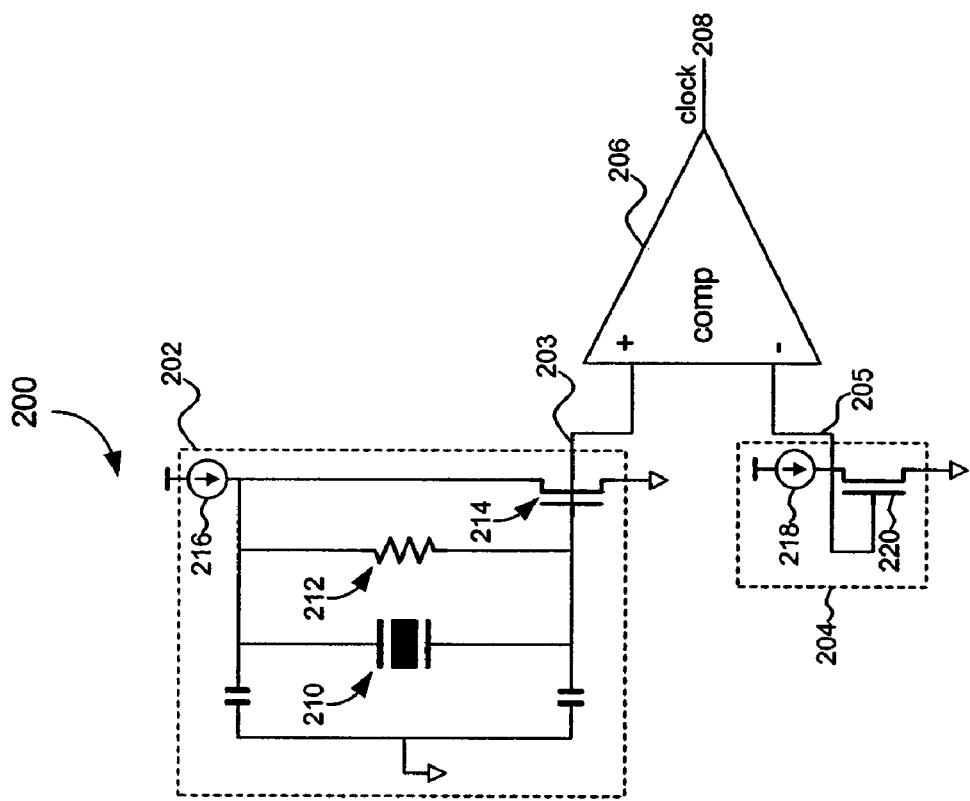
FIG. 2A illustrates a conventional single-ended structure using a replica circuit for signal generation.

FIG. 2A illustrates a conventional single ended crystal oscillator 200 that includes an oscillator portion 202, a replica circuit 204, and a comparator 206 that are used to generate the 50% duty cycle clock signal 208. Preferably, the clock signal 208 is a square wave with a 50% duty cycle.

The oscillator portion 202 includes a crystal 210, a resistor 212, and a FET 214 that is biased by a current source 216. The crystal 210 provides a low impedance feedback path at its characteristic resonant frequency that causes the FET device 214 to oscillate, producing an oscillating sinusoidal signal 203 that is coupled to one of the input terminals of the comparator 206. The replica circuit 204 is an active circuit having a current source 218 and a FET 220. The current source 218 supplies a current to the FET 220 that generates a corresponding gate voltage 205 for the FET 220. The gate voltage 205 is used to set the DC point for the comparator 206 input. The DC point 205 from the replica circuit 204 is compared with the oscillating sinewave signal 203 from the oscillator portion 202, so as to trigger the squarewave clock output 208. In other words, the comparator 206 outputs a clock pulse when the sinewave 203 from the oscillating circuit 202 crosses the DC point that is established by the replica circuit 204. This is further illustrated in FIG. 2B, which is discussed below.

Figure 2B:
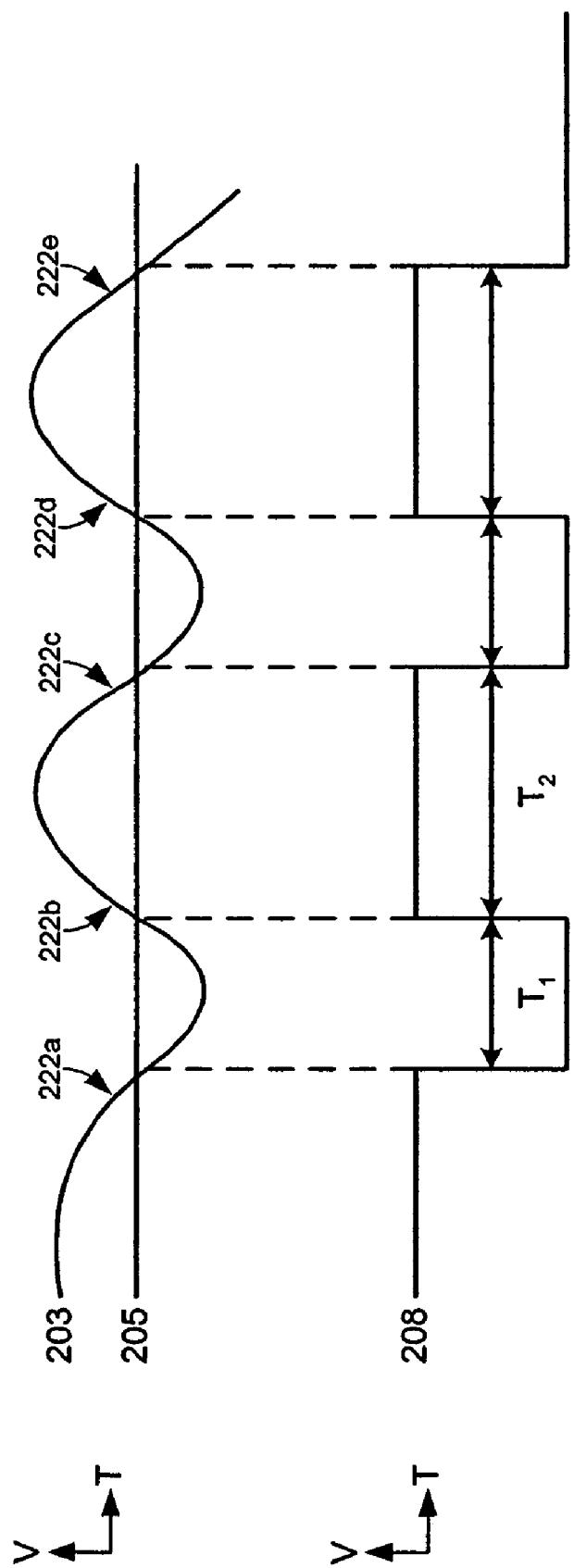
FIG. 2B illustrates signal diagrams that are associated with the conventional single-ended structure that is shown in FIG. 2A.

FIG. 2B demonstrates a problem that can occur with the conventional oscillator 200. FIG. 2B illustrates the sinewave 203 and the DC point 205, and resulting output clock signal 208. The comparator 206 triggers at the cross points 222 of the sinewave 203 and the DC point 205 to produce the clock output 208. The problem occurs when the DC component of the sinewave 203 is not equal to the DC point 205. When this occurs, then the cross points 222 are not equally separated in time from each other (i.e. not equally distant along the time axis), and the clock output 208 does not have a 50% duty cycle as shown in FIG. 2B. In other words, $T_1$ is not equal to $T_2$ in the resulting clock output 208.

Figure 3:
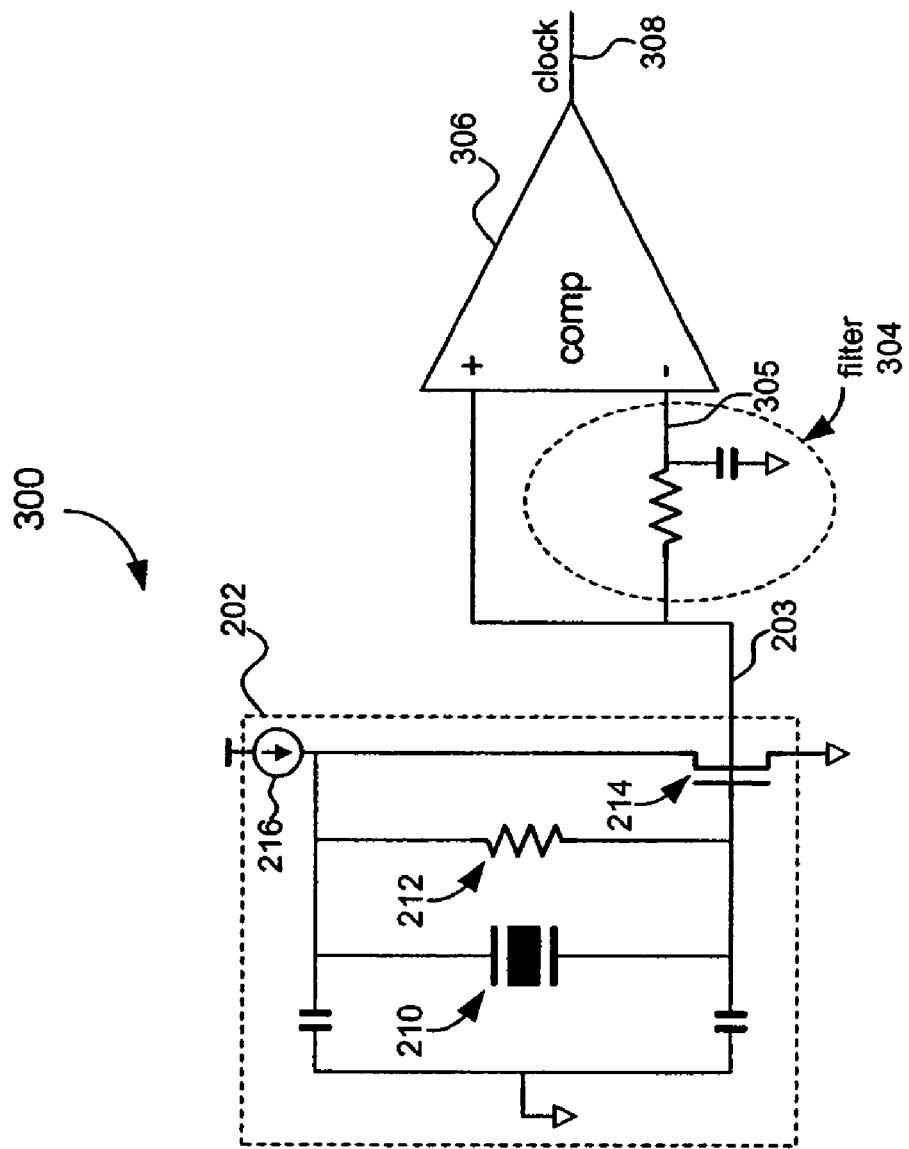
FIG. 3 illustrates a single ended crystal oscillator that uses a lowpass filter to generate a 50% duty cycle output according to embodiments of the present invention.

FIG. 3 illustrates a clock generator circuit 300 according to embodiments of the present invention. The clock generator circuit 300 includes the single-ended crystal oscillator portion 202 (also called active circuit 202), a lowpass filter circuit 304, and a comparator 306. As discussed above, the single-ended oscillator portion 202 generates an oscillating signal 203. The oscillating signal 203 is received at an input of the comparator 306, and is also received at the lowpass filter circuit 304. The output 305 of the lowpass filter circuit 304 is the other input to the comparator 306, so as to generate the 50% duty cycle output 308, as is described further below.

Figure 4:
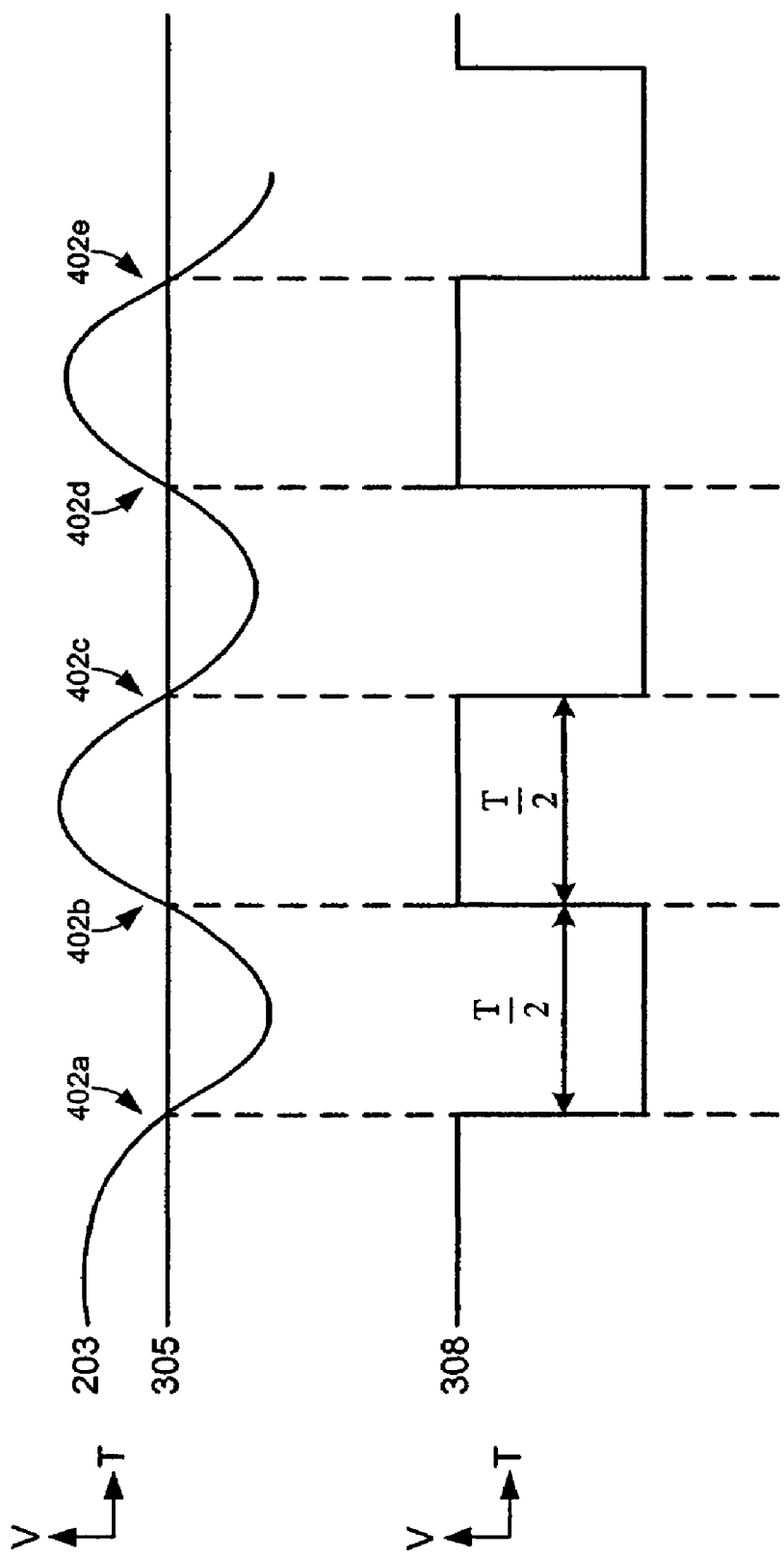
FIG. 4 illustrates signal diagrams that are associated with the single-ended oscillator structure of FIG. 3 when the lowpass filter passes only DC.
Figure 5:
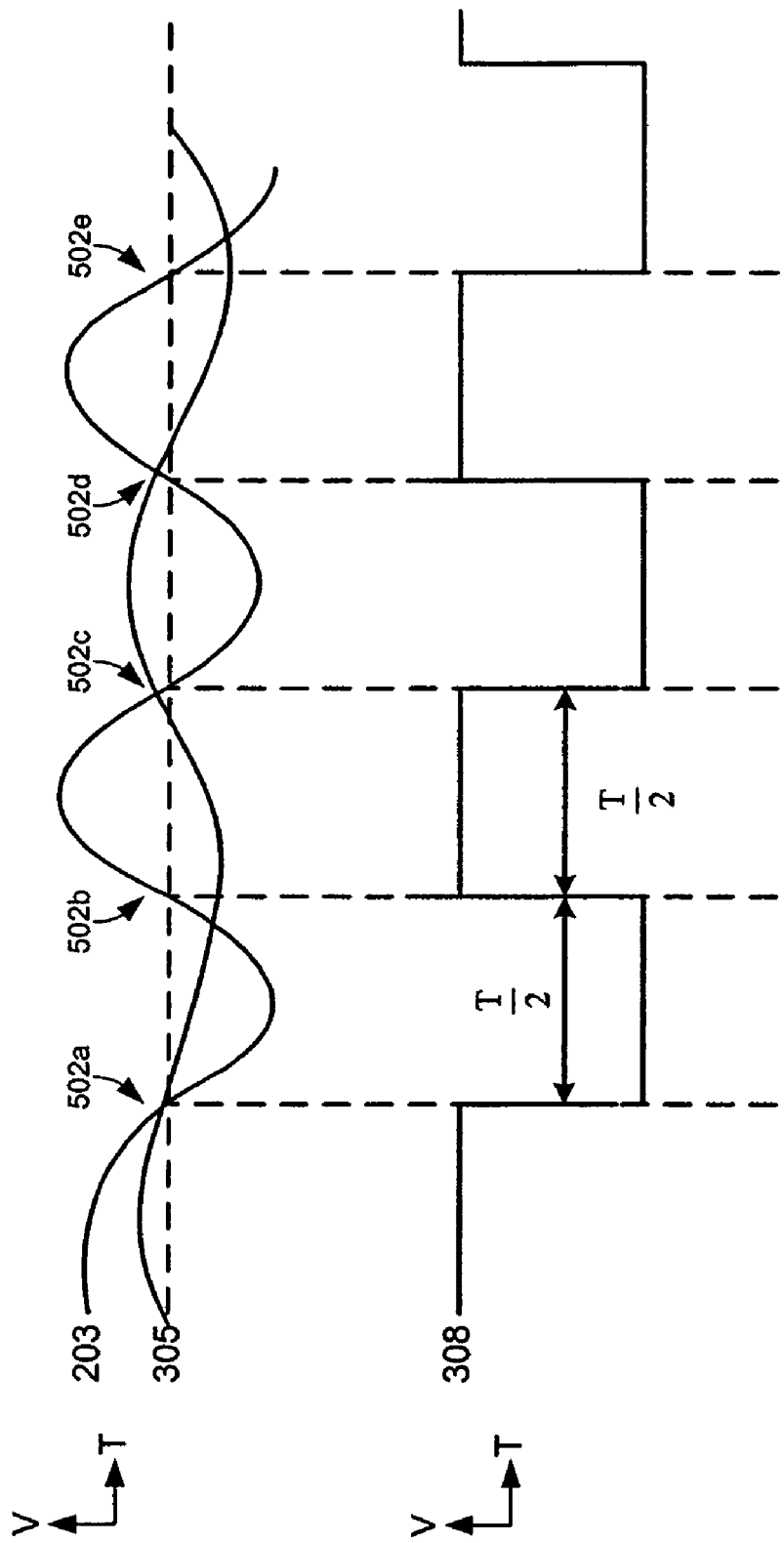
FIG. 5 illustrates signal diagrams that are associated with the single-ended oscillator structure of FIG. 3 when the lowpass filter passes an attenuated waveform.

FIGS. 4 and 5 further illustrate the operation of the clock generator circuit 300 using comparative signal diagrams 203, 305, and 308 from FIG. 3.

FIG. 4 illustrates signal waveforms 203, 305, and 308 when using a low pass filter 304. Assuming lowpass filter 304 passes only DC, then the comparator 306 receives a sinewave signal 203 and a DC signal 305. The comparator 306 compares the sinewave signal 203 to the DC signal 305 and triggers at the crossing points 402, to produce the output clock 308. Note that a substantially perfect 50% duty cycle is achieved for the output clock 308 because the crossing points 402 are equally separated in time (i.e. equally distant along the time axis of FIG. 4), which is the definition of a 50% duty cycle for a periodic signal. The cross-points 402 are equally separated in time because the DC signal 305 was derived from the oscillating signal 203, and therefore has the same DC component as the oscillating signal 203. Whereas, in FIG. 2, the DC point 205 is generated independently from the oscillating signal 203, and therefore is subject to error when compared to that of the oscillating signal 203.

FIG. 5 illustrates the signal waveforms 203, 305, and 308 when the filter 304 is a non-ideal lowpass filter 304 that passes more than just DC. In other words, FIG. 5 illustrates the filtered signal 305 having the same frequency and DC component and attenuated relative to the oscillation sinewave 203, which is a more realistic filter output than that of FIG. 3. Despite the imperfect filter output 305, the comparator 306 will still trigger at the crossing points 502, which are equally separated in time to produce a 50% duty cycle output 308 at the output of the comparator 306. As in FIG. 4, the crossing points 502 are equally separated in time because the filter output 305 has the same DC component and frequency as the oscillating signal 203.

Filter 304 is preferably a low pass filter, as shown FIG. 3. For example, it would be preferable if the filter 304 only passed DC as shown in FIG. 2, but this not required. Lowpass filters having a passband above DC can also be utilized as discussed above and shown in FIG. 5. In one embodiment, the filter circuit 304 is a RC circuit. However, the filter circuit 304 is not necessarily an RC circuit. Any circuit could be used for filter circuit 304 that delays and/or attenuates the signal by some amount while keeping the same waveform with the same frequency and the same DC component. The RC circuit is one solution. For example, a delay module can be used instead of a low pass filter, as shown in FIG. 6.

Figure 6:
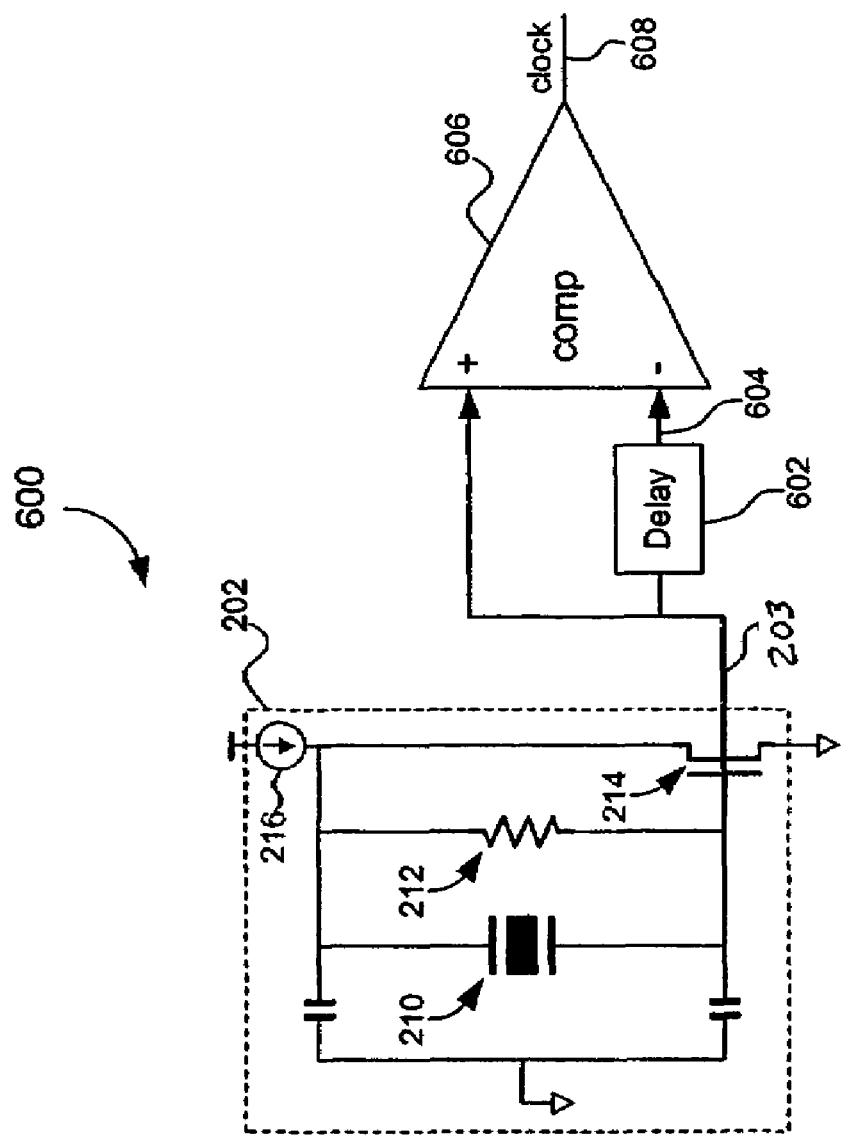
FIG. 6 illustrates a single ended crystal oscillator that uses a delay to generate a 50% duty cycle output according to embodiments of the present invention.

FIG. 6 illustrates an clock generator circuit 600 that is similar to the clock generator circuit 300, except that a delay module 602 replaces the filter 304. The delay module 602 delays the sinewave 203 to produce a delayed sinewave 604 that is compared to the original sinewave 203 in the comparator 606, so as to produce the clock output 608. Any amount of delay can be utilized as long as the comparator 606 can recognize the amplitude crossing points of the two signals, as will be shown in FIG. 7.

Figure 7:
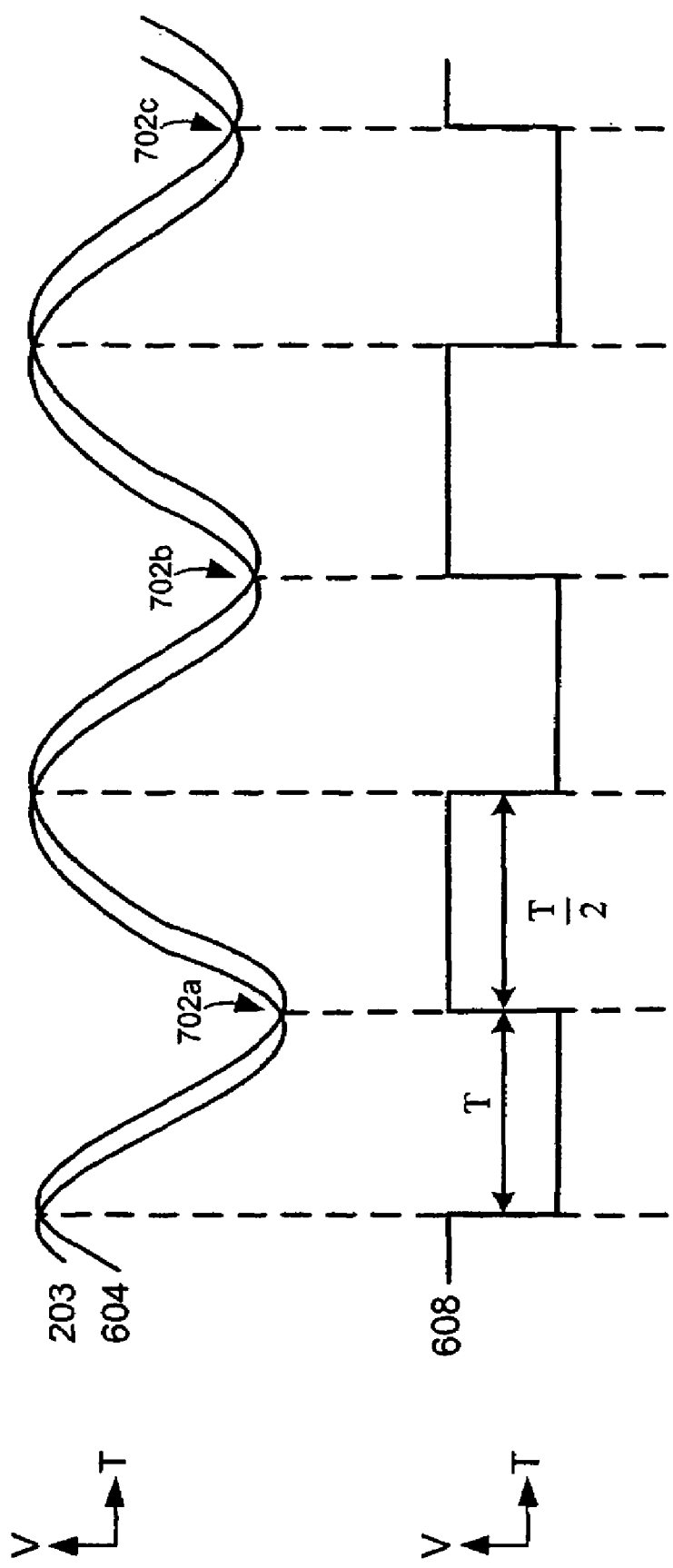
FIG. 7 illustrates signal diagrams that are associated with the single-ended oscillator structure of FIG. 6 and uses a delay for the second comparator input.

FIG. 7 illustrates the signal waveforms 203, 604, and 608 to further describe the clock generator circuit 600. The delay element 602 delays the oscillation sinewave 203 to generate a delayed sinewave 604, as shown in the FIG. 6. The comparator 606 compares the delayed sinewave 604 with the sinewave 203, and triggers at the crossing points 702 as shown in FIG. 7. The cross points 702 are equally separated in time to produce a 50% duty cycle output 608. The amount of delay is flexible. In other words, any delay can be used as long as the comparator 606 can recognize the cross points 702.

Figure 8:
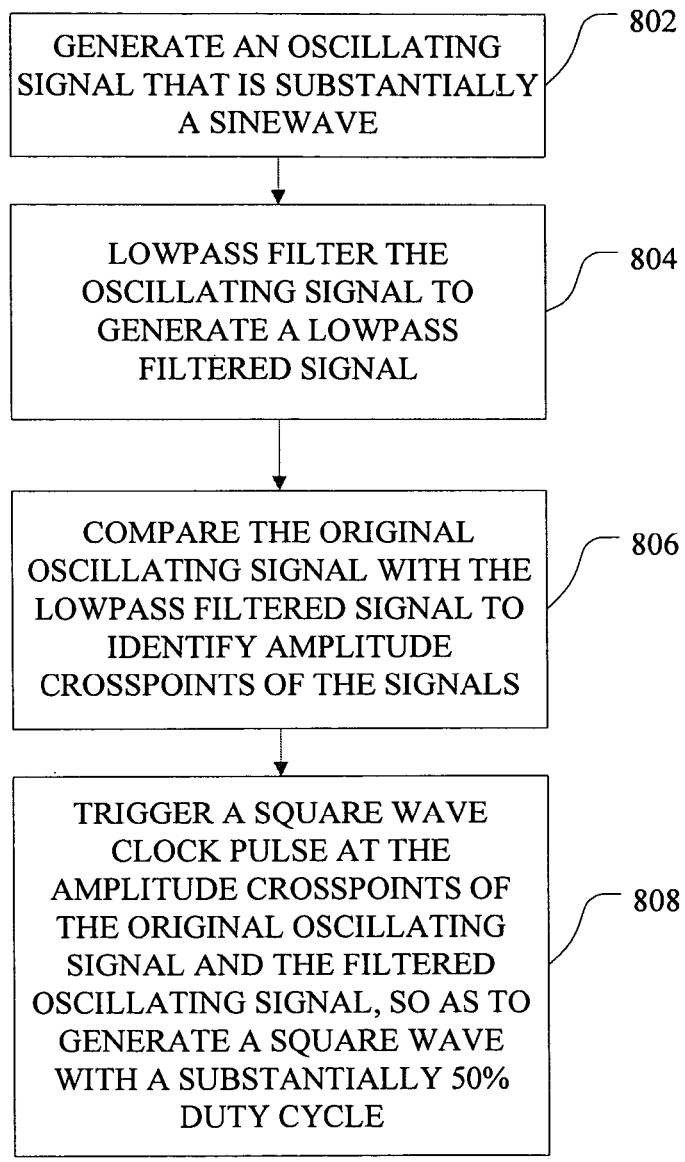
FIG. 8 illustrates a flowchart 800 that further describes the invention using a lowpass filter to generate the second oscillating signal.
Figure 9:
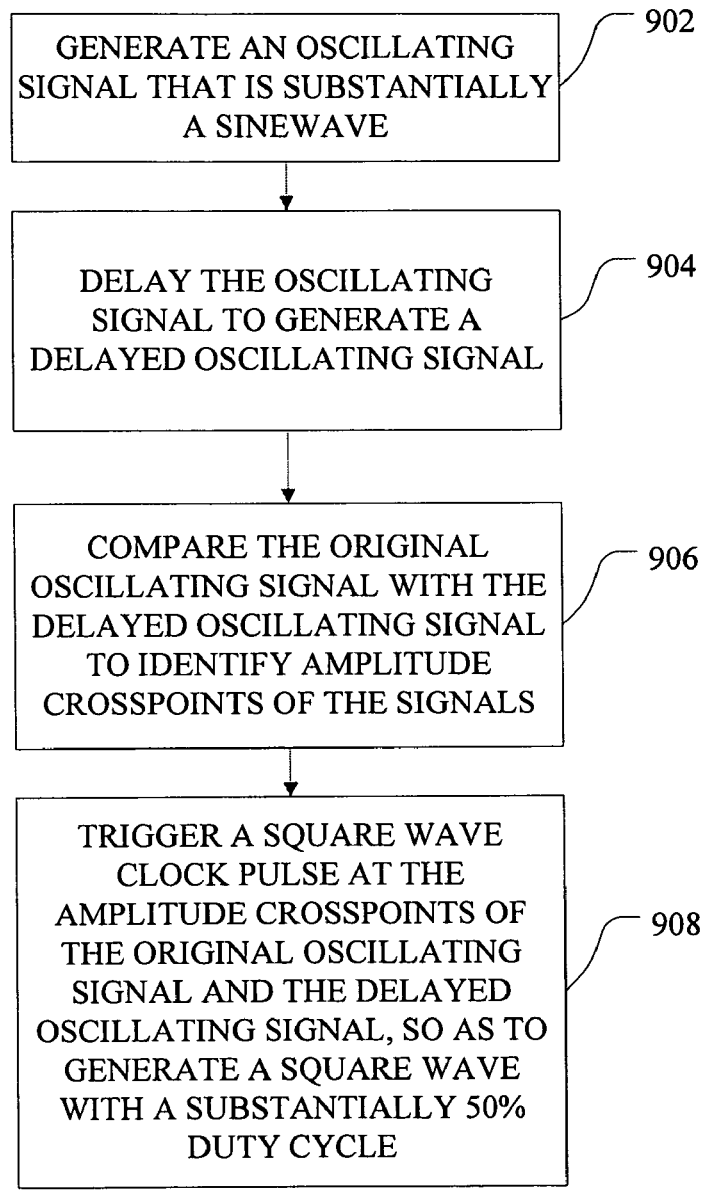
FIG. 9 illustrates a flowchart 900 that further describes the invention using a delay to generate the second oscillating signal.

FIGS. 8 and 9 illustrate respective flowcharts 800 and 900 to further describe the operation of the invention. More specifically, flowchart 800 further describes the operation of the clock generator circuit 300 using a lowpass filter according to embodiments of the present invention. Flowchart 900 further describes the operation of the clock generator circuit 600 using a delay circuit according embodiments of the present invention.

Referring to FIG. 8, in step 802, an oscillating signal is generated that is substantially a sinewave. For example, oscillator portion 202 generates a sinewave signal 203.

In step 804, the oscillating signal is lowpass filtered to produce a filtered oscillating signal, or more specifically a lowpass filtered oscillating signal. For example, the filter 304 lowpass filters the oscillating signal 203.

In step 806, the original oscillating signal is compared with the lowpass filtered oscillating signal to determine the amplitude cross points of the respective signals. In other words, the signals are compared to determine where their amplitudes cross each other.

In step 808, a square wave clock pulse is triggered at the cross points of the original oscillating signal and the filtered oscillating signal. In other words, the square wave pulse is triggered when the amplitude of the original oscillating signal rises above or falls below the lowpass filtered oscillating signal, so as to generate a square wave that substantially has a 50% duty cycle.

Flowchart 900 further describes the operation of the clock generator circuit 600 using a delay circuit according to embodiments of the present invention. Referring to FIG. 9, in step 902 (similar to step 802), an oscillating signal is generated that is substantially a sinewave. For example, oscillator portion 202 generates a sinewave signal 203.

In step 904, the oscillating signal is delayed to produce a delayed oscillating signal. For example, the delay 602 in FIG. 6 delays the oscillating signal 203 to produce a delayed oscillating signal 604. The amount of delay is flexible.

In step 906, the original oscillating signal is compared with the delayed oscillating signal to determine the amplitude cross points of the respective signals. In other words, the signals are compared to determine where their amplitudes cross each other.

In step 908, a square wave clock pulse is triggered at the cross points of the original oscillating signal and the delayed oscillating signal. In other words, the square wave pulse is triggered when the amplitude of the original oscillating signal rises above or falls below the delayed oscillating signal, so as to generate a square wave with a substantially 50% duty cycle.

Figure 10:
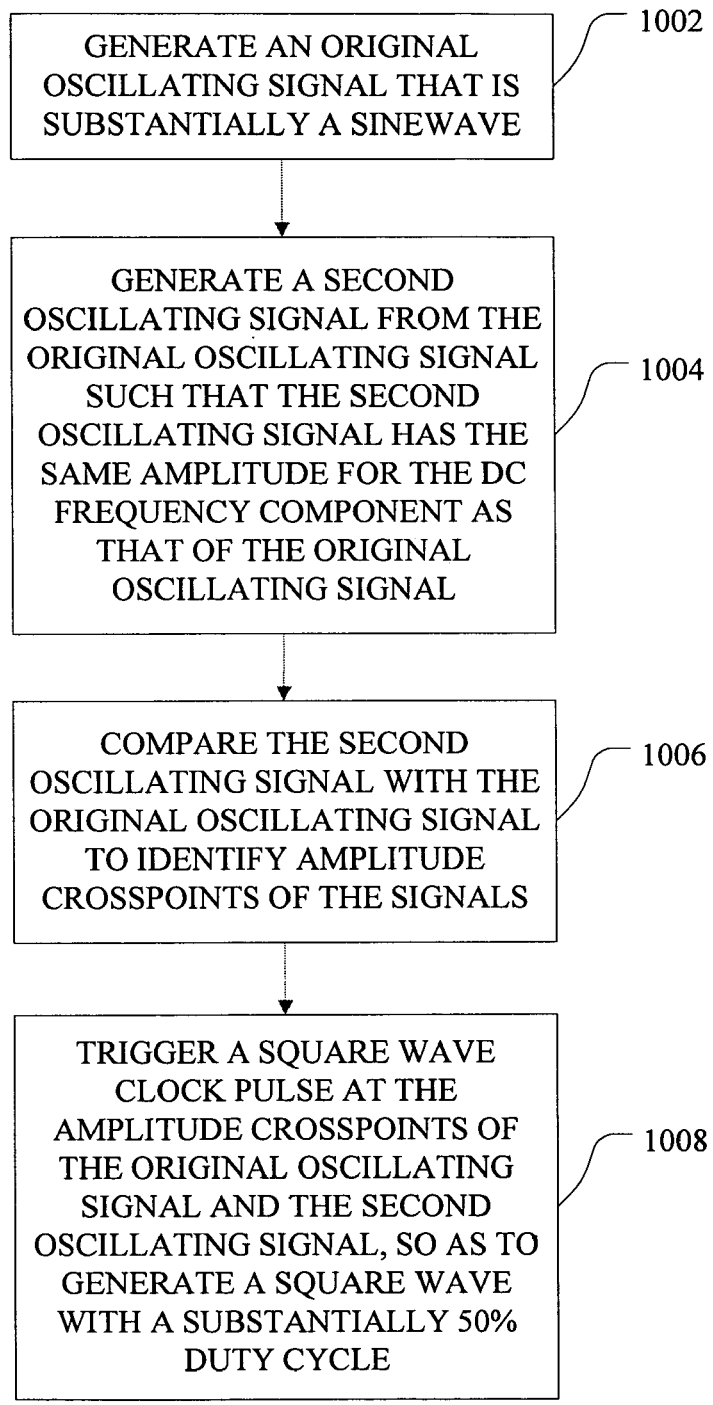
FIG. 10 illustrates a flowchart 1000 that further describes the operation of the invention using first and second signals.

FIG. 10 provides another description of the invention using a flowchart 1000 that is more generic than that described in flowcharts 800 and 900 of FIGS. 8 and 9. Specifically, flowchart 1000 refers to only first and second oscillating signals, where the second oscillating signal has the same frequency and the same DC component as the first oscillating signal.

Referring to FIG. 10, in step 1002 (similar to steps 802 and 902), an oscillating signal is generated that is substantially a sinewave. For example, oscillator portion 202 generates a sinewave signal 203.

In step 1004, a second oscillating signal is generated from the first oscillating signal that has a DC component that has the same amplitude as the DC component of the original oscillating signal. For example, the second oscillating signal can be a filtered or delayed version of the first oscillating signal so that the original and second oscillating signals have a common DC component.

In step 1006, the original oscillating signal is compared with the second oscillating signal to determine the amplitude cross points of the respective signals. In other words, the signals are compared to determine where their amplitudes cross each other.

In step 1008, a square wave clock pulse is triggered at the cross points of the original oscillating signal and the second oscillating signal. In other words, the square wave pulse is triggered when the amplitude of the original oscillating signal rises above or falls below the second oscillating signal, so as to generate a square wave with a substantially 50% duty cycle.

The clock generators 300 and 600 cost much less than conventional designs that use a differential design (FIG. 1), and are much more accurate than using a replica bias circuit in a single-ended design (FIG. 2). Further, the differential crystal oscillator structure is more complicated and difficult to design than embodiments of the present invention, and the differential design uses substantially more current. Using the replica bias circuit in a single-ended crystal oscillator structure also uses more current, and is less accurate.

The clock generators 300 and 600 use almost half as much current when compared with the differential design, and the clock generators 300 and 600 are more accurate than the replica bias techniques used in the single-ended design.

In a crystal oscillator design, a good-enough sine wave is typically available, and this invention can be applied almost in any single-ended crystal oscillator structure.

The present invention described herein includes use of a crystal oscillator. However, other types of oscillators could be used that include resonant elements other than crystals, as will be understood by those skilled in the arts.

Conclusion

Example embodiments of the methods, systems, and components of the present invention have been described herein. As noted elsewhere, these example embodiments have been described for illustrative purposes only, and are not limiting. Other embodiments are possible and are covered by the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

What is claimed is:

1. A clock generator, comprising:
   an oscillator portion that produces an oscillating signal;
   a lowpass filter that filters said oscillating signal to produce a filtered oscillating signal; and
   a comparator that compares said oscillating signal to said filtered oscillating signal to produce an output signal having an approximate 50% duty cycle.

2. The clock generator of claim 1, wherein said lowpass filter is an RC filter.

3. The clock generator of claim 1, wherein said oscillator portion includes a crystal that determines a frequency of said oscillating signal.

4. The clock generator of claim 1, wherein said oscillator portion is single-ended.

5. The clock generator of claim 1, wherein said filtered oscillating signal has a DC component that is the same as that of said oscillating signal.

6. The clock generator of claim 1, wherein said oscillator portion is an active circuit, and said lowpass filter is a passive circuit.

7. The clock generator of claim 1, wherein said output signal is a square wave.

8. The clock generator of claim 7, wherein said comparator triggers a pulse of said square wave at amplitude cross points of said oscillating signal and said filtered oscillating signal.

9. A clock generator, comprising:
   an oscillator portion that produces an oscillating signal;
   a delay circuit that delays said oscillating signal to produce a delayed oscillating signal; and
   a comparator that compares said oscillating signal to said delayed oscillating signal to produce an output signal having an approximate 50% duty cycle.

10. The clock generator of claim 9, wherein said oscillator portion includes a crystal that determines a frequency of said oscillating signal.

11. The clock generator of claim 9, wherein said oscillator portion is single-ended.

12. The clock generator of claim 9, wherein said filtered oscillating signal has a DC component that is the same as that of said oscillating signal.

13. The clock generator of claim 9, wherein said oscillator portion is an active circuit, and said lowpass filter is a passive circuit.

14. The clock generator of claim 9, wherein said output signal is a square wave.

15. The clock generator of claim 14, wherein said comparator triggers a pulse of said square wave at amplitude cross points of said oscillating signal and said filtered oscillating signal.

16. A method of generating an output oscillating signal having a duty cycle of substantially 50%, comprising:
  generating an original oscillating signal;
  filtering said original oscillating signal to generate a filtered oscillating signal;
  comparing said original oscillating signal and said filtered oscillating signal to identify amplitude cross points of said compared signals; and
  triggering a pulse of said output oscillating signal at said amplitude cross points so that said output oscillating signal has a substantially 50% duty cycle.

17. The method of claim 16, wherein said step of triggering includes generating a pulse of a square wave when an amplitude of said original oscillating signal rises above or falls below said filtered oscillating signal.

18. A method of generating an output oscillating signal having a duty cycle of substantially 50%, comprising:
  generating an original oscillating signal;
  delaying said original oscillating signal to generate a delayed oscillating signal;
  comparing said original oscillating signal and said delayed oscillating signal to identify amplitude cross points of said compared signals; and
  triggering a pulse of said output oscillating signal at said amplitude cross points so that said output oscillating signal has a substantially 50% duty cycle.

19. The method of claim 18, wherein said step of triggering includes generating a pulse of a squarewave when an amplitude of said original oscillating signal rises above or falls below said filtered oscillating signal.

* * * * *